(12) United States Patent
Appleyard et al.

(10) Patent No.: US 8,486,198 B2
(45) Date of Patent: Jul. 16, 2013

(54) METHOD OF PROCESSING SUBSTRATES

(75) Inventors: Nicholas John Appleyard, Bristol (GB); Kevin Powell, Bristol (GB)

(73) Assignee: Aviza Technology Limited, Newport, South Wales (GB)

( * ) Notice: Subject to any disclaimer, the term of this patent is extended or adjusted under 35 U.S.C. 154(b) by 1086 days.

(21) Appl. No.: 11/997,737

(22) PCT Filed: Jul. 12, 2006

(86) PCT No.: PCT/GB2006/002565
§ 371 (c)(1),
(2), (4) Date: Apr. 3, 2008

(87) PCT Pub. No.: WO2007/015050
PCT Pub. Date: Feb. 8, 2007

(65) Prior Publication Data
US 2008/0230510 A1    Sep. 25, 2008

Related U.S. Application Data

(60) Provisional application No. 60/707,966, filed on Aug. 15, 2005.

(30) Foreign Application Priority Data

Aug. 4, 2005  (GB) .................................. 05116054.4

(51) Int. Cl.
*B08B 3/12* (2006.01)
*B08B 6/00* (2006.01)
*B08B 7/00* (2006.01)
*B08B 7/02* (2006.01)

(52) U.S. Cl.
USPC .................. 134/1; 134/1.1; 134/1.2; 134/1.3

(58) Field of Classification Search
None
See application file for complete search history.

(56) References Cited

U.S. PATENT DOCUMENTS

| 4,985,114 A |   | 1/1991 | Okudaira et al. |
| 5,356,478 A | * | 10/1994 | Chen et al. ........................ 134/1 |

(Continued)

FOREIGN PATENT DOCUMENTS

| EP | 0871211 A2 | 10/1998 |
| JP | 01050427 | 2/1989 |

(Continued)

OTHER PUBLICATIONS

Anand J. Bariya, et al. "The etching of $CHF_3$ Plasma Polymer in Fluorine-Containing Discharges," Journal of Vacuum Science & Technology B9 Jan./Feb. 1991, No. 1 New York, US, pp. 1-7.

(Continued)

*Primary Examiner* — Duy Deo
(74) *Attorney, Agent, or Firm* — Volentine & Whitt, PLLC

(57) ABSTRACT

This invention relates to a method of processing substrates including: (a) etching, in a chamber, a generally vertical structure in a substrate using a cyclic process including an etch step using a reactive etch gas and a deposition step for depositing a protective polymer on to the side walls of that part of the structure which has already been etched by a preceding etch step or steps; and (b) cleaning, in the absence of any substrate, the chamber of material deposited thereon by the performance of the deposition step in step (a) characterized in that following the cleaning of the deposition derived material, the chamber is cleaned of material derived from the etchant gas by exposing the chamber to a plasma containing a mixture of $O_2$ and at least the active element of elements of the etchant gas.

7 Claims, 1 Drawing Sheet

U.S. PATENT DOCUMENTS

| | | | | |
|---|---|---|---|---|
| 5,486,235 A | * | 1/1996 | Ye et al. | 134/1.1 |
| 5,501,893 A | | 3/1996 | Laermer et al. | |
| 5,647,953 A | * | 7/1997 | Williams et al. | 134/1.1 |
| 5,756,400 A | * | 5/1998 | Ye et al. | 438/710 |
| 6,068,729 A | | 5/2000 | Shrotriya | |
| 2003/0192568 A1 | * | 10/2003 | Zheng et al. | 134/1.1 |

FOREIGN PATENT DOCUMENTS

| | | |
|---|---|---|
| JP | 2105413 A | 4/1990 |
| JP | 5055184 A | 3/1993 |
| JP | 2003243360 A | 8/2003 |
| JP | 2005515631 A | 5/2005 |
| WO | WO 02/090615 A1 | 11/2002 |
| WO | WO 03/060975 A1 | 7/2003 |

OTHER PUBLICATIONS

European Search Report for corresponding Great Britain Application No. GB0516054.4 dated Nov. 30, 2005.

International Search Report and the Written Opinion of the International Application No. PCT/GB200/002565 dated Oct. 12, 2006.

* cited by examiner

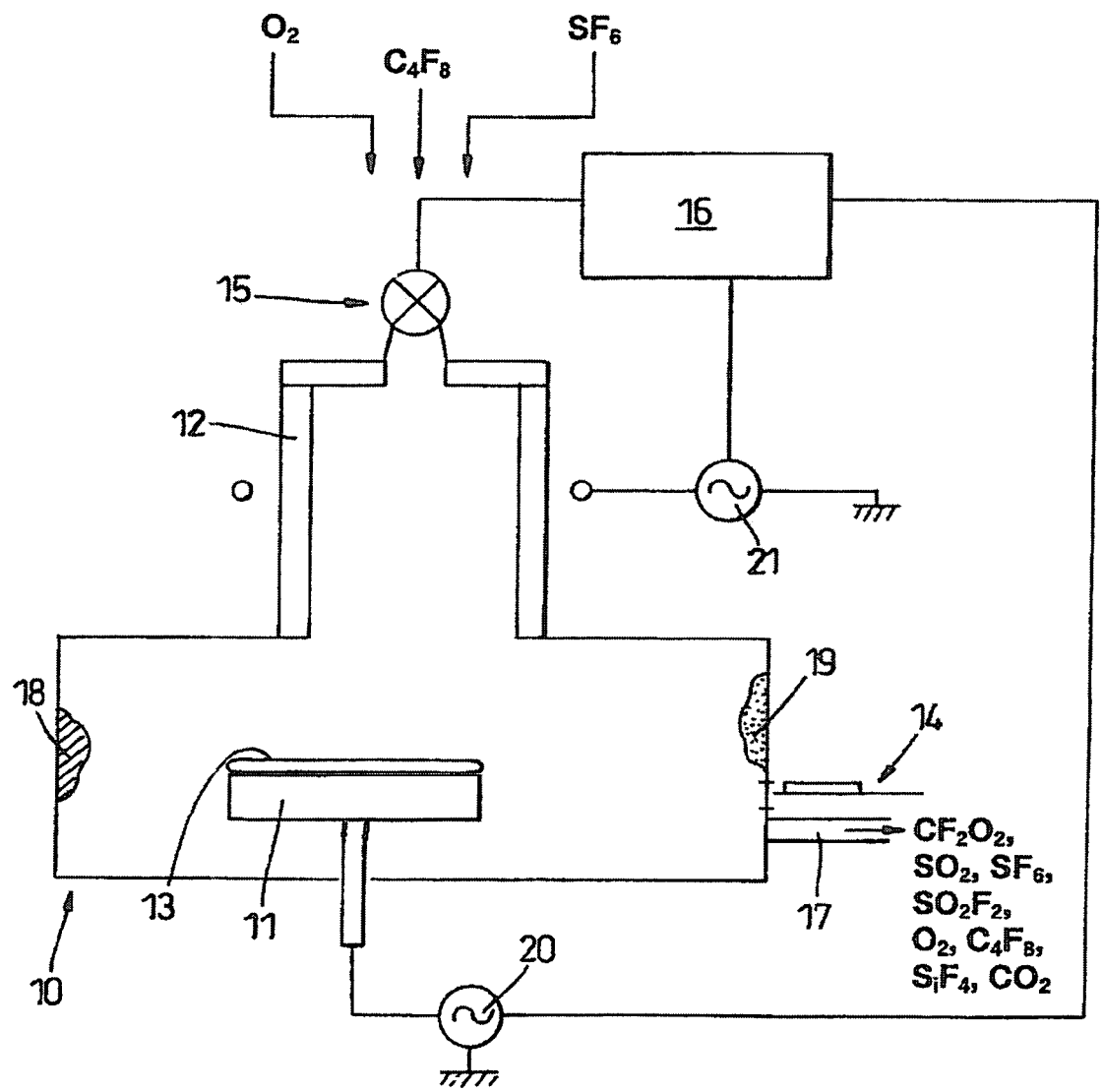

METHOD OF PROCESSING SUBSTRATES

CROSS REFERENCE TO RELATED APPLICATIONS

This Application is a United States National Stage Application filed under 35 U.S.C. §371 of PCT Patent Application Serial No. PCT/GB2006/002565 filed on Jul. 12, 2006, which claims the benefit of and priority to Great Britain (GB) Patent Application Serial No. 0511605.4 filed on Aug. 4, 2005, and U.S. Provisional Patent Application Ser. No. 60/707,966 filed on Aug. 15, 2005, the disclosures of both of which are hereby incorporated by reference in their entirety.

This invention relates to a method of processing substrates.

In the production of semi-conductor devices and many nano-technology devices, it is necessary to form generally vertical structures in substrates. This is most conveniently done by chemical etching, but for a long time there were difficulties with such an approach, because that part of the structure, which was closest to the exposed surface of the substrate was subjected to much more etching than that part of the substrate which was furthest from the exposed surface, with the result that the side walls of the structure did not extend vertically. One of the most successful solutions to these problems was developed by Bosch and is the subject of their International Patent Application U.S. Pat. No. 5,501,893. In the preferred embodiment of this Bosch process the etch step uses $SF_6$ gas as a source of etchant. During the etching process, flowing radicals combine with silicon atoms of the substrate, with the result that they can no longer be available to recombine with the sulphur and solid sulphur deposits on the side walls of the chamber and on the chamber furniture. This reaction is generally of the form:

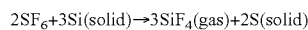

$2SF_6+3Si(solid)\rightarrow 3SiF_4(gas)+2S(solid)$

The deposition process uses $O_4F_8$ source gas to deposit polymer on the substrate, but it is also deposited on the chamber walls and any exposed chamber furniture, which for the purposes of this specification will be incorporated in the term "chamber". This reaction is as follows:

$4CF_2\rightarrow 4(CF_2)_n(solid).$

An oxygen plasma is conventionally used to clean the chamber between substrates of batches of substrates using the following process:

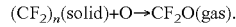

$(CF_2)_n(solid)+O\rightarrow CF_2O(gas).$

It might be supposed that this process would also remove the deposited sulphur by converting it into sulphur dioxide, but in practice the oxygen is insufficiently reactive to ensure complete removal of the sulphur in a single chamber cleaning process.

The result is that in subsequent processing of substrates the deposited sulphur reacts with fluorine in the etchant gas reducing the etch rate on the substrate, with the result that process times are increased and/or the etch structure is not as designed.

From one aspect the invention consists in a method of processing substrates including:
(a) etching, in a chamber, a general vertical structure in a substrate using a cyclic process including an etch step using a reactive etch gas and a deposition step for depositing a protective polymer on the side walls of that part of the structure which has already been etched by a preceding etch step or steps; and
(b) cleaning, in the absence of any substrate, the chamber of material deposited thereon by the performance of the deposition step in step (a) characterised in that following the cleaning of the deposition derived material, the chamber is cleaned of material derived from the etchant gas by exposing the chamber to a mixture of a plasma containing a mixture of $O_2$ and at least the active element or elements of the etchant gas.

In a preferred embodiment the mixture of step (b) is $O_2$ and the etchant gas, and it is particularly preferred that the etchant gas is $SF_6$. Alternatively, as in its broadest definition, the active element of the etchant gas may be fluorine.

At least part of the cleaning process may include ion bombardment.

From another aspect a method of processing substrates including:
(a) etching, in a chamber, a generally vertical structure in a substrate using a cyclic process including an etch step using a reactive etch gas and a deposition step for depositing a protective polymer on to the side walls of that part of the structure which has already been etched by a preceding etch step or steps; and
(b) successively cleaning in separate steps a first material deposited by one of the etch and deposition steps and a second material of different chemistry deposited by the other of the etch and deposition steps, each cleaning step being performed by a cleaning process employing a respective plasma containing a respective gas mixture, the gas mixtures being different from each other.

Although the invention has been defined above it is to be understood it includes any inventive combination of the features set out above or in the following description.

The invention may be performed in various ways and specific embodiments will now be described, by way of example, with reference to the accompanying drawing which illustrates a chamber for processing substrates.

In FIG. 1 a chamber, generally indicated at 10 is illustrated schematically. The chamber has a substrate support 11 and a bell jar 12 and, for the purposes of this specification, references to the chamber 10 are to be understood to include both these items and any other items of chamber furniture on which deposition may take place. Substrates 13, such as silicon wafers, can be placed on and removed from the support 11, by conventional wafer handling apparatus generally indicated at 14. A valve mechanism schematically indicated at 15 enables $C_4F_8$, $O_2$ and $SF_6$ to be supplied to the bell jar 12 in accordance with the process parameters which are established by a control 16. This control 16 also determines gas flow and other operative parameters of the process to be run in the chamber 10. A pump outlet is provided at 17 for the removal of excess process gas and engaseous by-products.

In the Applicants' general proposal the "Bosch" process described above is run in the chamber to form the desired vertical structure in the substrate 13. As described above polymer 18 and sulphur 19 can become deposited on the chamber wall and on the chamber furniture during this process. After the removal of the process substrate 13 by the handling apparatus 14, the chamber is initially subjected to an oxygen cleaning plasma which cleans the organic depositions 18 by the process described above and the resultant $CF_2O$ gas, and any other gaseous by products, is removed via the pump outlet 17.

A second plasma is then run in the form of a mixture of $O_2$ and some suitable catalyst which will enable the sulphur to be stripped by the oxygen gas by enabling the breaking of the S—S bonds. The Applicants have realised that in order to avoid complications in subsequent etch/deposition processes, it is desirable that the catalyst should be constituted by the active element or elements of the etchant gas. Thus in the described "Bosch" process the catalyst should be fluorine and it is particularly convenient to use the etchant gas itself, because then nothing is being introduced into the chamber, which would not already appear.

Thus in the Applicants' preferred process the mixture is $O_2$ and $SF_6$ which results in the following reaction:

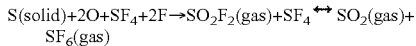

This double process, in particular, is surprising, because even if the concept of using the etchant gas as a catalyst had been reached, intuitively it would be expected that one simply had to run a single step of $O_2$ and $SF_6$. In fact if this is run before the organic material 18 is removed, then the $SF_6$ will react with the polymer material in the same manner as the etching process resulting in the further deposition of sulphur i.e. the carbon deposits become replaced by sulphur deposits.

The Applicants have found that for their processing chamber which is sold under the Trade Mark OMEGA DSi the following process conditions are effective. It will be appreciated that other chamber geometries and process conditions may require further adjustments based on the principles set out above. The process conditions are as follows:

|  | Polymer removal step | Sulphur removal step |
| --- | --- | --- |
| $O_2$ flow (sccm) | 700 | 400 |
| $SF_6$ flow (sccm) | 0 | 200 |
| Pressure (mtorr) | 30 | 30 |
| Source power (W) | 3200 | 3000 |
| Platen power (W) | 20 | 20 |
| Duration (minutes) | 2 (endpointed) | 3 between wafers OR 30 between batches |

The Applicants have also run a process using 400 sccm $SF_6$ and 200 sccm $O_2$ for sulphur removal, which worked effectively.

The polymer removal step can be endpointed by monitoring the carbon emission lines in the plasma. The endpoint is reached when these disappear. Optical omissions spectroscopy methods may be used to endpoint both the polymer removal and sulphur removal steps.

The cleaning process could be performed after every wafer or after batches of wafers, depending on the amount of material which is being deposited.

Ion bombardment can be used to assist either step and may be particularly useful in connection with sulphur removal. In this case an RF voltage might be applied to support 11 or other parts of the chamber. This possibility is illustrated at 20 in the FIGURE. An RF source 21 is also supplied for powering the showerhead 12 to strike and maintain a plasma in the manner, which is well known to those skilled in the art.

The method has the significant advantage that the chemicals used for the cleaning process are identical with those used in the known process. Hence the method overcomes the current disadvantages experienced with the "Bosch" process without the user having to make any alteration to their apparatus or etch procedures. Nor will any resultant product require re-certification or approval.

It will be noted that in contrast to many prior art arrangements the cleaning process is acting on components derived from the process gases and not material which originates from the substrate or from gases given off by the substrate.

The invention claimed is:

1. A method of processing substrates, comprising:
    (a) performing a cyclic process, in a chamber, on a substrate to form an opening therein delimited by generally vertical side wall surfaces,
    wherein the cyclic process includes an etch step of removing a portion of the substrate with a reactive etchant gas and a subsequent deposition step of depositing a protective polymer onto the side wall surfaces which delimit the opening of that part of the structure which has already been formed by the preceding etch step or steps, and the etchant gas includes at least an active element and a non-active element; and
    (b) cleaning the chamber, in the absence of any substrate in the chamber, of material deposited thereon by the performance of the deposition step of the cyclic process of step (a), by:
    first cleaning the chamber of the polymer; and
    subsequently cleaning the chamber of the non-active element of the etchant gas by introducing $O_2$ gas and a catalyst into the chamber at respective flow rates, and generating a plasma from the $O_2$ gas and the catalyst to expose the chamber to a plasma containing a mixture of the $O_2$ gas and the catalyst,
    wherein the catalyst includes at least the active element of the etchant gas and the flow rate at which the $O_2$ gas is introduced into the chamber is greater than that at which the catalyst is introduced into the chamber, so that the catalyst causes a breaking of bonds of the non-active element derived from the etchant gas and such that the non-active element derived from the etchant gas is stripped from surfaces of the chamber by the $O_2$ gas.

2. A method as claimed in claim 1 wherein the mixture in step (b) is $O_2$ and the etchant gas.

3. A method as claimed in claim 2 wherein the etchant gas is $SF_6$.

4. A method as claimed in claim 1 wherein the active element is fluorine.

5. A method as claim in claim 4 wherein the non-active element is sulfur (S).

6. A method as claim in claim 1 wherein the non-active element is sulfur (S).

7. A method as claim in claim 5, wherein the mixture is $O_2$ and $SF_6$, and the following reaction occurs in cleaning the chamber of the non-active element:

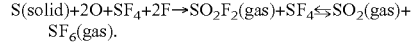

* * * * *